(12) United States Patent
Divakaruni et al.

(10) Patent No.: US 6,309,924 B1
(45) Date of Patent: Oct. 30, 2001

(54) METHOD OF FORMING SELF-LIMITING POLYSILICON LOCOS FOR DRAM CELL

(75) Inventors: Ramachandra Divakaruni, Somers; Jack Allan Mandelman, Stormville; Irene Lennox McStay, Hopewell Junction, all of NY (US); Larry A. Nesbit, Farmington, CT (US); Carl John Radens, LaGrangeville; Helmut Horst Tews, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/585,898

(22) Filed: Jun. 2, 2000

(51) Int. Cl.$^7$ ................................. H01L 21/8242
(52) U.S. Cl. ................. 438/243; 438/239; 438/248; 438/386; 438/391; 365/149; 365/182
(58) Field of Search ..................... 438/238, 239, 438/243–249, 253, 386–392, 770, 787; 365/149, 182

(56) References Cited

U.S. PATENT DOCUMENTS

| | | | |
|---|---|---|---|
| 5,406,515 | * 4/1995 | Rajeevakumar | 365/182 |
| 5,877,061 | * 3/1999 | Halle et al. | 438/386 |
| 5,909,044 | 6/1999 | Chakravarti et al. | 257/301 |
| 5,937,292 | 8/1999 | Hammerl et al. | 438/243 |
| 5,977,579 | 11/1999 | Noble | 257/302 |
| 5,981,332 | 11/1999 | Mandelman et al. | 438/246 |
| 5,985,729 | 11/1999 | Wu | 438/389 |
| 5,998,253 | 12/1999 | Loh et al. | 438/243 |
| 6,037,208 | 3/2000 | Wei | 438/243 |

* cited by examiner

Primary Examiner—Matthew Smith
Assistant Examiner—Craig P. Lytle
(74) Attorney, Agent, or Firm—John A. Jordan

(57) ABSTRACT

A method of forming relatively thin uniform insulating collar in the storage trench of a storage trench DRAM cell. A DRAM trench is first formed in a silicon substrate. Then, a nitride liner is deposited on the silicon trench walls. The nitride liner may be deposited directly on the silicon walls or on an underlying oxide layer. A layer of amorphous silicon is then deposited over the nitride liner. A silicon nitride layer is deposited on the oxidized surface of the amorphous silicon. A resist is formed in the lower portion of the trench, and the exposed silicon nitride layer on top of the amorphous silicon is removed, leaving the upper portion of the amorphous silicon layer exposed. The upper portion of the layer of amorphous silicon is then oxidized so as to form a relatively thin, uniform collar along the entire circumference of the trench. The nitride liner underlying the amorphous silicon layer enhances the thickness uniformity of the amorphous silicon layer and thereby the uniformity of the resulting oxide collar. The nitride liner also acts to limit lateral oxidation of the silicon trench walls during oxidation of the amorphous silicon layer. The nitride liner underlying the collar is also effective in cell operation to control the cell charge at the collar-substrate interface.

12 Claims, 7 Drawing Sheets

METHOD OF FORMING SELF-LIMITING POLYSILICON LOCOS FOR DRAM CELL

CROSS REFERENCE TO RELATED APPLICATIONS

Aspects of the present invention are related to subject matter disclosed in co-pending applications entitled "Structure and Process for 6F2 Trench Capacitor DRAM Cell with Vertical MOSFET and 3F Bitline", U.S. Ser. No. 09/602,426 filed Jun. 23, 2000 and, "Process Flow for Maskless Single Sided Buried Strap Formation of Vertical Cell", U.S. Ser. No. 09/603,442 filed Jun. 23, 2000, each assigned to the assignee of the present invention.

BACKGROUND OF THE INVENTION

1. Field of the Invention

The present invention generally relates to dynamic random access memory (DRAM) cells. More particularly, the present invention relates to a process for the formation of a thin insulating collar in the capacitive storage trench of DRAM cells.

2. Background and Related Art

Capacitive storage trenches are commonly employed in DRAM cells. A trench capacitor is a three-dimensional structure typically formed in a silicon substrate. A conventional trench capacitor is formed by etching a trench into the substrate. The trench is typically filled with n+ doped polysilicon which serves as one plate of the capacitor (referred to as the storage node). The second plate of the capacitor, referred to as a "buried plate," is formed by, for example, outdiffusing n+ dopants from a dopant source into a region of the substrate surrounding the lower portion of the trench. A dielectric layer is provided to separate the two plates thereby forming the capacitor. To prevent or reduce parasitic leakage that occurs along the upper portion of the trench to an acceptable level, an oxide collar of sufficient thickness is provided therein. Typically, the oxide collar is sufficiently thick to reduce the parasitic leakage to an inappreciable amount. Typical of said prior art trench capacitor DRAM cells is that described in U.S. Pat. No. 5,981,332 to Mandelman, et al., entitled "Reduced Parasitic Leakage In Semiconductor Devices" and assigned to the assignees of the present invention.

It is known that continued demand to shrink devices has facilitated the design of DRAM cells with greater density and smaller feature size and cell area. For example, design rules have been scaled from 0.25 microns ($\mu$m) down to about 0.12 nm and below. At the smaller ground rules, the control of vertical parasitic MOSFET leakage from the buried-plate becomes more difficult due to the smaller trench dimensions. This is because a smaller trench opening necessitates a corresponding reduction in collar thickness to facilitate filling of the trench. However, to reduce the parasitic leakage to below an acceptable level, the thickness of the collar needs to be of some minimum dimension, depending on operating voltage conditions. Collar thickness hinders the filling of the smaller trench.

One of the difficulties in fabricating trench collars is that during high temperature process steps used in fabricating the cells, in general, there is a tendency for lateral growth or enlargement of the storage trench shape in the silicon substrate. This is particularly so during the process of thermal oxidation of material used to form the collar itself on the trench wall. Such oxidation steps can cause significant lateral growth of the storage trench due to simultaneous oxidation of the silicon substrate. This is particularly harmful in the fabrication of a hybrid DRAM cells where there is a vertically gated MOSFET within the same storage trench, with a bit line contact positioned above the adjacent vertical gate channel of the MOSFET. In such an arrangement, lateral growth of the trench reduces bit line contact area thereby limiting reduction in cell size or causing device failure.

Another difficulty with fabricating trench collars by means of oxidation of the silicon substrate is the ability to make the collars so they are uniform in thickness throughout the trench circumference without the bumps due to sporadic nucleation; and without thickness variations due to crystallographic effects on the local oxidation rate. Both effects make it difficult to effectively modulate the charge in the collar along the collar-silicon substrate interface. Inability to modulate the charge makes it difficult to control the vertical parasitic leakage and minimize the floating body effect.

SUMMARY OF THE INVENTION

In accordance with the teachings of the present invention, DRAM cells with capacitive storage trenches are fabricated having relatively thin insulating collar structures of uniform thickness throughout the circumference of the collar. Trenches are first formed in a silicon substrate. Then, an underlying nitride liner is formed on the silicon trench walls prior to depositing a layer of amorphous silicon thereon. The nitride liner may be deposited directly on the silicon walls or on an underlying oxide layer. A layer of amorphous or polycrystalline silicon is then deposited, followed by the formation of a thin oxide on top of the amorphous/polycrystalline silicon, followed by the deposition of a thin silicon nitride layer on top of the thin oxide. A resist is then formed in the lower portion of the trench leaving the upper portion of the amorphous silicon layer exposed. The silicon nitride layer in the exposed upper portion of the trench is removed; followed by the removal of the resist in the lower portion of the trench. The upper portion of amorphous silicon (not covered by the silicon nitride layer) is then oxidized so as to consume all of the amorphous silicon and create a relatively thin, uniform collar along the entire trench circumference.

The nitride underlying the collar acts to enhance the thickness uniformity of the deposited amorphous silicon and thereby the uniformity of the resulting oxide collar. In addition, the nitride underlying the collar acts to limit lateral oxidation of the silicon trench walls during oxidation of the amorphous silicon layer with the oxidation of the amorphous silicon layer thereby being self-limiting. It should be noted that the nitride underlying the collar is also effective in cell operation to control the cell charge at the collar-substrate interface.

After formation of the collar, the silicon nitride, the oxide, the polycrystalline silicon (any amorphous silicon not oxidized would have crystallized into polycrystalline silicon), and the silicon nitride and oxide under the polycrystalline silicon layer in the lower portion of the trench is removed and a buried plate is formed in this lower portion. A node insulating layer is then formed on the buried plate and an n+ doped polysilicon fill is used to form the second plate or storage node. In vertical gate MOSFET applications, for example, trench top oxide is used to separate the storage node from the vertical MOSFET gate formed in the trench. In other MOSFET applications, the storage node may extend, for example, to the diffusion region of a lateral MOSFET at the surface of the substrate.

Accordingly, it is an object of the present invention to provide an improved trench capacitor memory cell.

It is another object of the present invention to provide an improved trench capacitor DRAM cell and method for making same.

It is yet another object of the present invention to provide a method of making a trench capacitor memory cell having a relatively thin insulating collar of uniform thickness overlying a thin layer of nitride in the upper portion of the trench.

It is a further object of the present invention to provide a method of fabricating a DRAM cell with trench capacitor that minimizes lateral growth or enlargement of the storage trench during fabrication heat treatment and thus maximizes cell electrical contact area at the surface.

It is yet a further object of the present invention to provide a method of making an insulating collar in the capacitive trench of DRAM cell so that oxidation of the layer of material used to form the collar is self-limiting.

These foregoing and other objects, features and advantages of the invention will be apparent from the following more particular description of a preferred embodiment of the invention, as illustrated in the accompanying drawings, wherein like reference members represent like parts of the invention.

DETAILED DESCRIPTION

Figure 1:
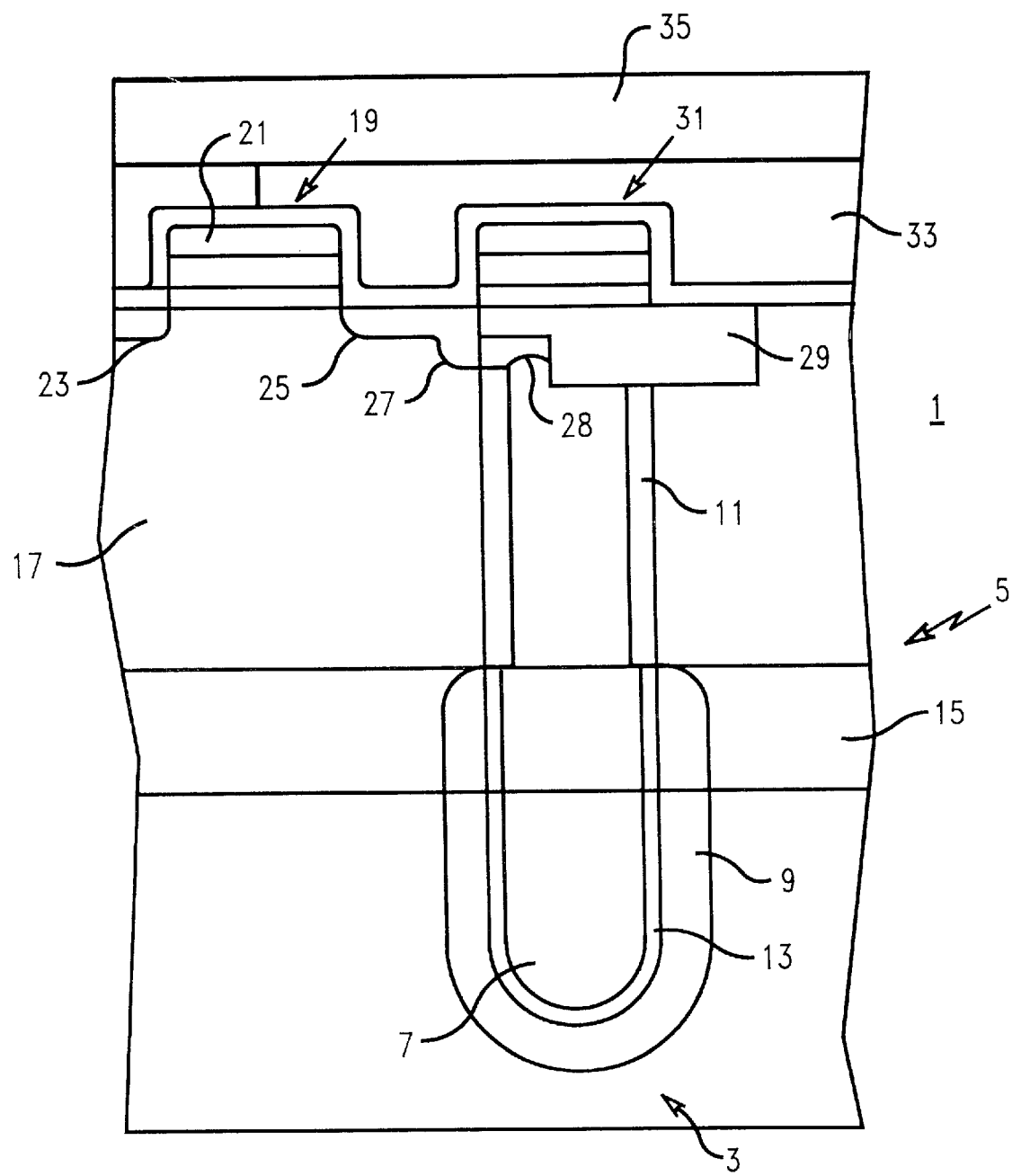
FIG. 1 depicts a cross-sectional side view of a typical conventional prior art trench capacitor DRAM cell.

It should be understood that the various DRAM cell features shown in the drawings and described herein are not to scale but are merely provided to facilitate an understanding of the description of the invention. It should also be understood that in the following description, numerous details of cell structures and process steps are given to provide background as an aid to understanding the particular aspects of the present invention. However, it would be obvious to one skilled in the art that the present invention may be practiced without some or all of these details. Moreover, in other instances, known structures and process steps have not been described in unnecessary detail in order to not obscure the invention.

The invention relates to memory cells employed in an integrated circuit (IC) and, more particularly, to trench capacitor DRAM cells employed in an IC. Typically, numerous ICs are formed, in parallel, on a silicon wafer. After processing is finished, the wafer is diced to separate the ICs into individual chips. The chips are then packaged, resulting in a final product that is used in, for example, computer systems, cellular phones, personal digital assistants (PDAs), and other electronic products.

Referring to FIG. 1, a typical conventional trench capacitor DRAM cell 1 employing an n-channel MOSFET is shown to facilitate description of the invention. Such a conventional trench capacitor DRAM cell is described in, for example, Nesbit, et al., "A 0.6 $\mu m^2$ 256 Mb Trench DRAM Cell With Self-Aligned Buried Strap (BEST)", IEDM 93-627, which is herein incorporated by reference for all purposes. Typically an array of such cells are interconnected by wordlines and bitlines to form a DRAM chip.

The DRAM cell 1 comprises a trench capacitor 3 formed in the lower portion of silicon substrate 5. The trench is filled with, typically, polysilicon 7 that is heavily doped with n-dopants. The polysilicon serves as one plate of the capacitor, referred to as a "storage node." A buried plate 9 doped with n-type dopants surrounds the lower portion of the trench. A node dielectric 13 separates the two plates of the capacitor. In the upper portion of the trench is a collar 11 fabricated to reduce parasitic leakage. A buried well 15 comprising n-type dopants is provided to connect the buried plates of the DRAM cells in the array. Above the buried well is a p-well 17. The p-well provides the correct doping type and concentration for the proper operation of the low leakage n-channel MOSFET.

On the top surface of the silicon substrate, the DRAM cell comprises a MOSFET 19. The transistor includes a gate 21 and source 23 and drain 25 diffusion regions comprising n-type dopants. As understood by those skilled in the art, the designation of source and drain depends on the operation of the transistor. The gate represents a wordline. Since the wordline gates the connection to the capacitor, it is typically referred to as an "active wordline". Connection of the transistor to the trench capacitor is achieved via a diffusion region 27, (referred to as the "node diffusion") and buried strap 28.

A shallow trench isolation (STI) 29 is provided to isolate the DRAM cell from other cells or devices. As shown, a wordline 31 gate stack is formed over the trench and isolated therefrom by the STI. Wordline gate stack 31 is referred to as the "passing wordline". Such configuration is referred to as a folded bitline architecture.

An interlevel dielectric layer 33 is formed over the wordlines. A conductive layer 35, representing a bitline, is formed over the interlevel dielectric layer. A bitline contact opening (not shown) is provided in the interlevel dielectric layer 33 to contact diffusion 23 to a bitline.

Figure 2A:
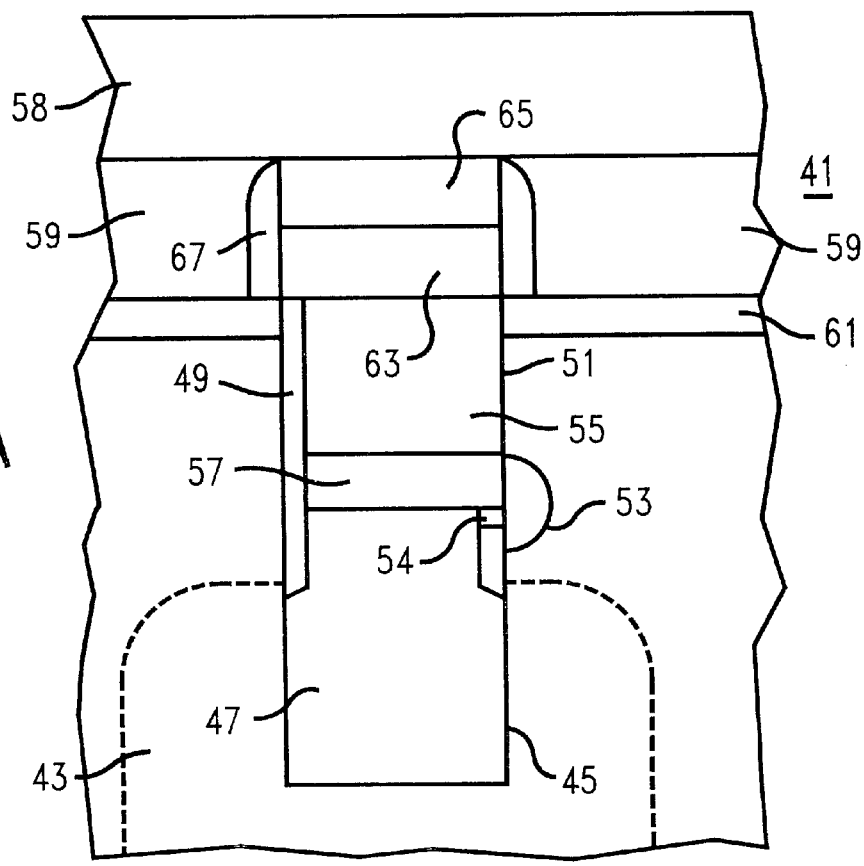
FIGS. 2A & B depict a cross-sectional side and top view, respectively, of a vertical gate trench capacitor DRAM cell.
Figure 2B:
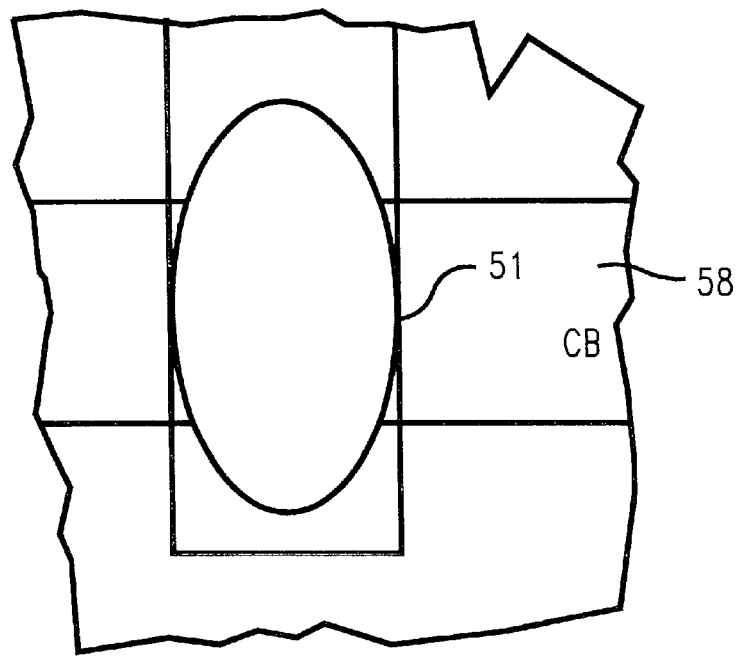

FIGS. 2A and B show another trench capacitor DRAM cell. One difference between the cell of FIG. 1 and the cell of FIG. 2A–B is that the cell of FIG. 2A–B employs a vertical gate trench capacitor DRAM cell structure wherein the gate is formed within the same trench as the capacitor.

With reference to FIG. 2A, then there is shown vertical gate trench capacitor DRAM cell 41 having buried plate region 43 doped with n-type dopants surrounding node dielectric 45. The dopant diffusion in plate region 43 extends sufficiently beyond the node so as to couple the n-doped plate region of the adjacent cells. The lower portion of the trench is filled with, typically, polysilicon 47 that is heavily doped with n-type dopants, similar to that described with respect to FIG. 1. This latter forms the second plate or storage node of the cell. Oxide collar 49 surrounds the upper part of the trench, except for the portion of the trench wall shown in FIG. 2A that is occupied by gate oxide 51 and buried strap 53. Gate oxide 51 is the gate oxide for vertical gate 55 formed in the trench. The peripheral portion of the trench wall occupied by gate oxide 51 and buried strap 53 is approximately defined by the width of bit line 58 in the FIG. 2A top view. Gate 55, which fills the trench and is surrounded by collar 49 and vertical gate oxide 51, is made of heavily doped n+ polysilicon. Gate 55 is separated from storage node 47 by trench top oxide layer 57. Buried strap region 53 is formed by the outdiffusion from the trench of an n-type dopant. Cell contact to bitline 58 is made through polysilicon bitline contact region 59, which is heavily doped with n-type dopants. Underlying bitline contact region 59 is n-type doped substrate diffusion region 61. Wordline contact of gate 55 is made through metallurgy 63, which metallurgy is isolated from bitline 58 by nitride layer 65 and from polysilicon region 59 by nitride sidewall 67.

As discussed previously, smaller groundrules that produce smaller trench dimensions require thinner collars to enable the filling of the trenches with poly. However, thinner collars, which allow the filling of the smaller trenches, may be inadequate to reduce the parasitic leakage to a desired level. Moreover, fabricating thinner collars requires control of lateral growth during oxidation and formation of uniform thickness of the collar without sporadic nucleation bumps throughout its wall surface.

Figure 3A:
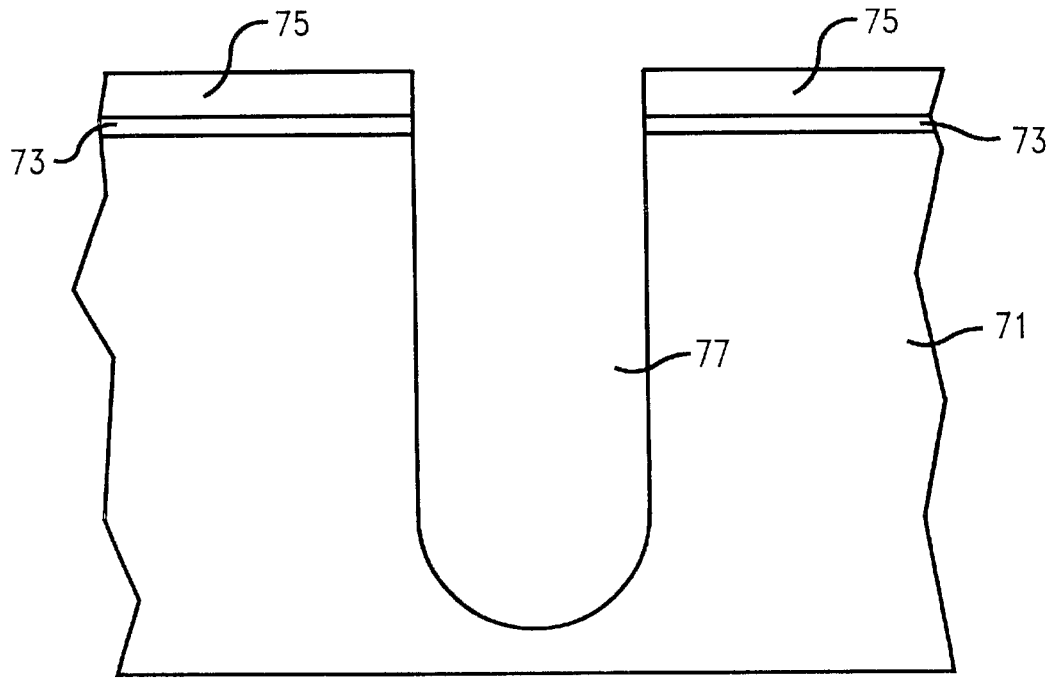
FIGS. 3A–3J depict cross-sectional side views illustrating various processing steps of fabricating an improved oxide collar typically used in trench capacitor DRAM cells, as exemplified in FIGS. 1 and 2.

With reference to FIG. 3A, there is shown a cross-sectional view of a single crystalline silicon substrate 71 with etched trench 77 representative of the initial steps in the formation of the oxide collar in accordance with present invention. The substrate 71 may, for example, be lightly or heavily doped with dopants of a pre-determined conductivity type to achieve the desired results. For example, the substrate of FIG. 3A may be lightly doped with p-type dopants, such as B. Initially, a silicon oxide layer is formed to approximately 5 nm to form pad oxide layer 73. This oxide layer may be formed thermally or by CVD. A silicon nitride layer approximately 100 nm thick is then formed on pad oxide layer 73 to form pad nitride layer 75. The pad oxide layer 73 and pad nitride layer 75 are then patterned by well known photolithography techniques leaving an exposed silicon area in the layers to allow the cell deep trench 77 shown in FIG. 3A to be formed. It is clear that in the fabrication of DRAM arrays, an array of trenches are so formed in parallel. Deep trench 77 is formed, for example, by anisotropic etching, such as reactive ion etching (RIE).

Figure 3B:
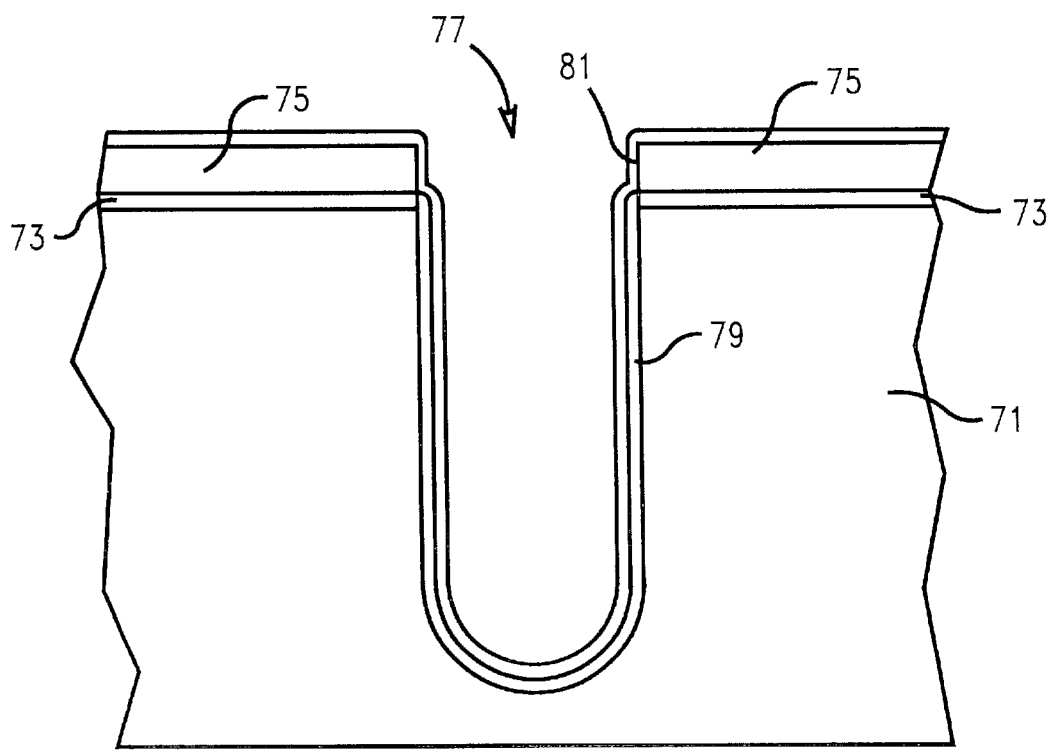

After formation of deep trench 77 shown in FIG. 3A, a deep trench oxidation step is carried out to form deep trench oxide liner 79, shown in FIG. 3B. This may be formed by thermal oxidation at a temperature of approximately 900° C. to form a liner thickness of approximately 5 nm. Thereafter, deep trench nitride liner 81 is formed on deep trench oxide liner 79 and pad nitride 75. Nitride liner 81 may be deposited, for example by CVD, to a thickness of between 3 and 10 nm, with 8.8 nm providing an effective thickness.

Figure 3C:
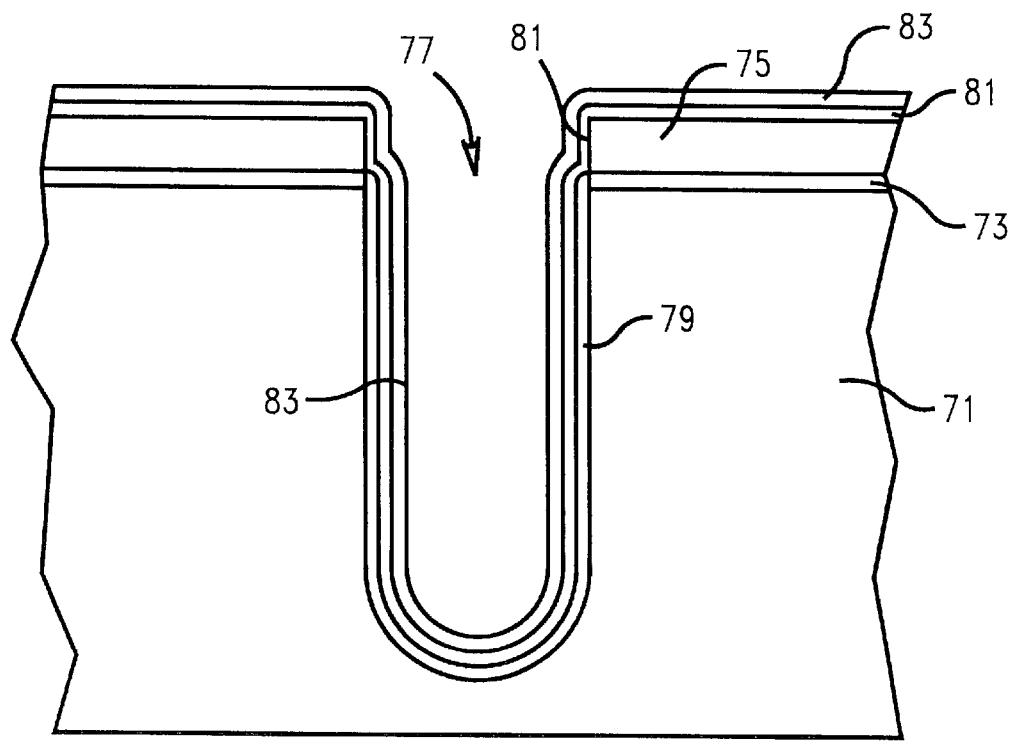

Nitride liner 81 is then covered with an amorphous silicon layer 83, as shown in FIG. 3C. Amorphous silicon is deposited upon nitride liner 81 to a thickness of approximately 25 nm. The amorphous silicon may also be deposited by CVD. Thereafter, the amorphous silicon layer is thermally oxidized to form a thin amorphous silicon oxide layer approximately 3 nm thick (not shown). This later layer is formed as an etch stop for a subsequent etching step.

Figure 3D:
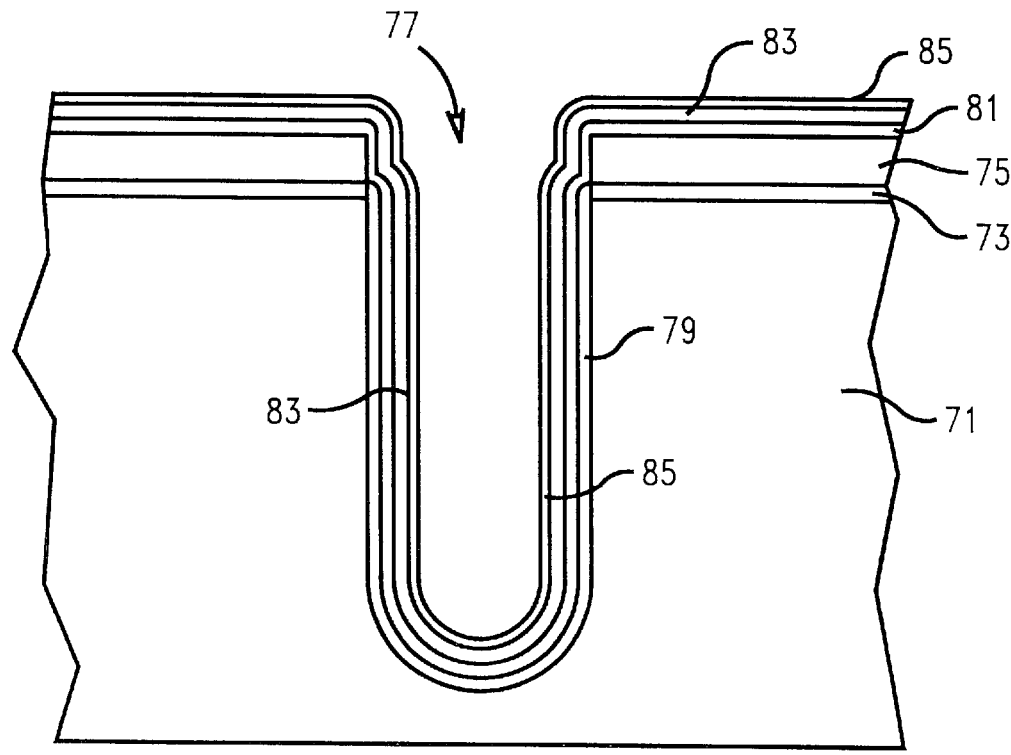
Figure 3:
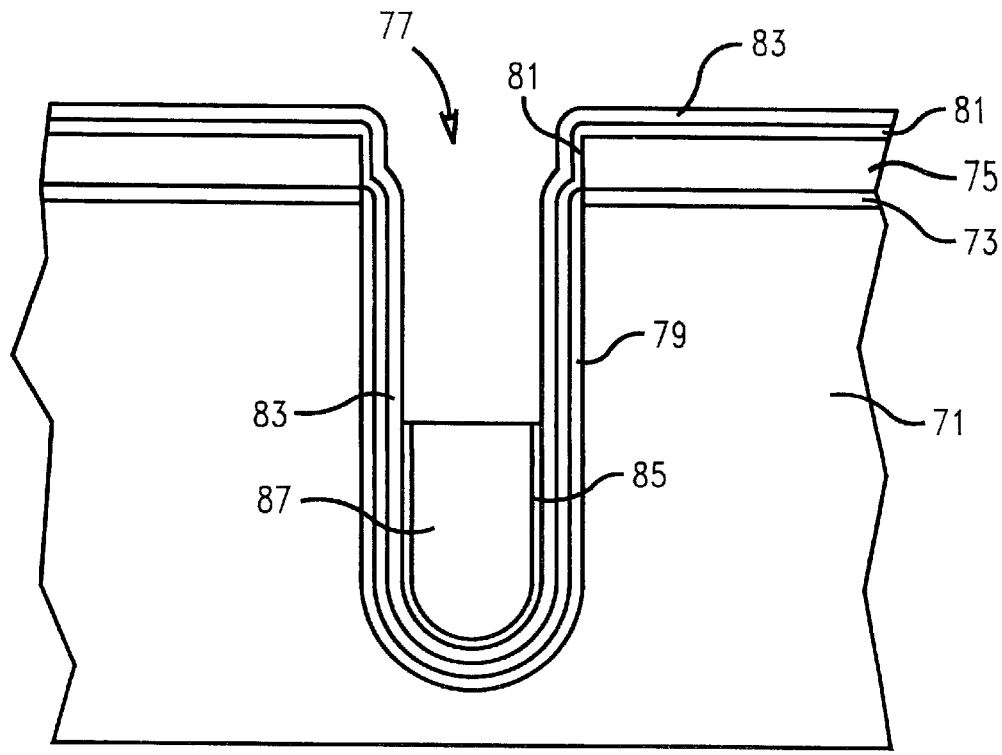
Figure 3:
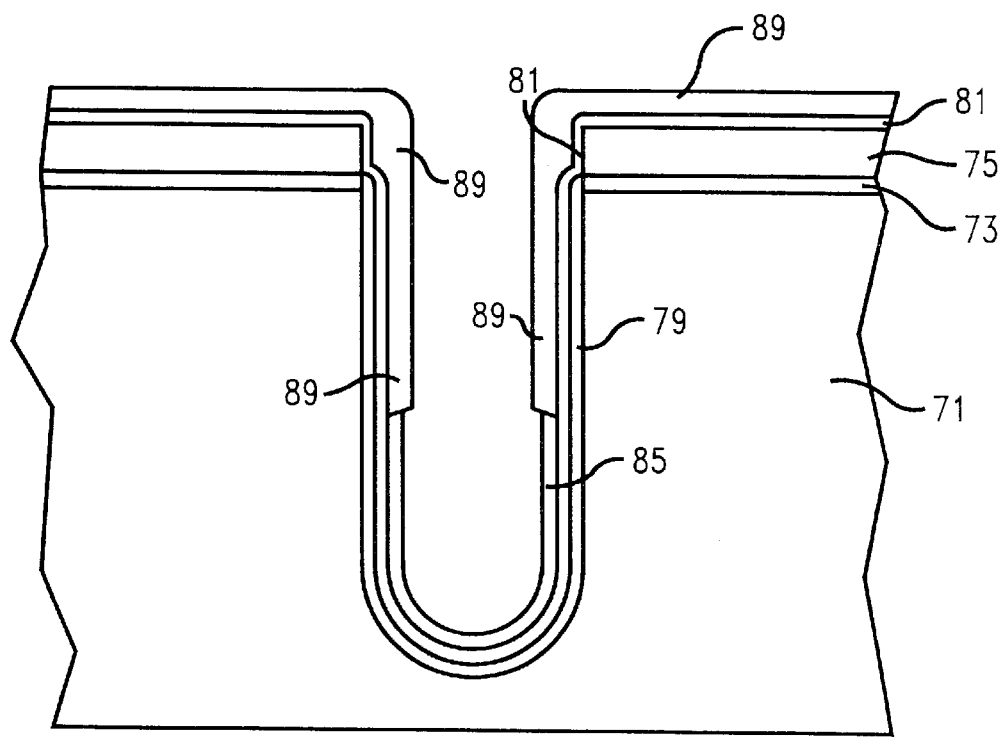
Figure 3:
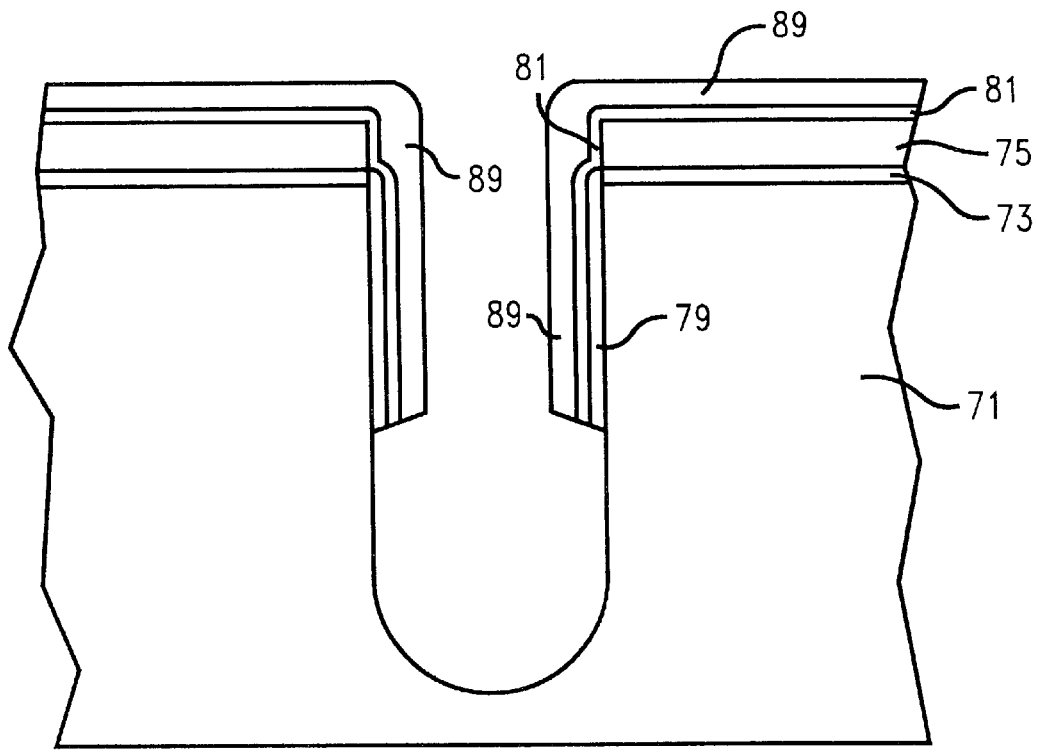
Figure 3:
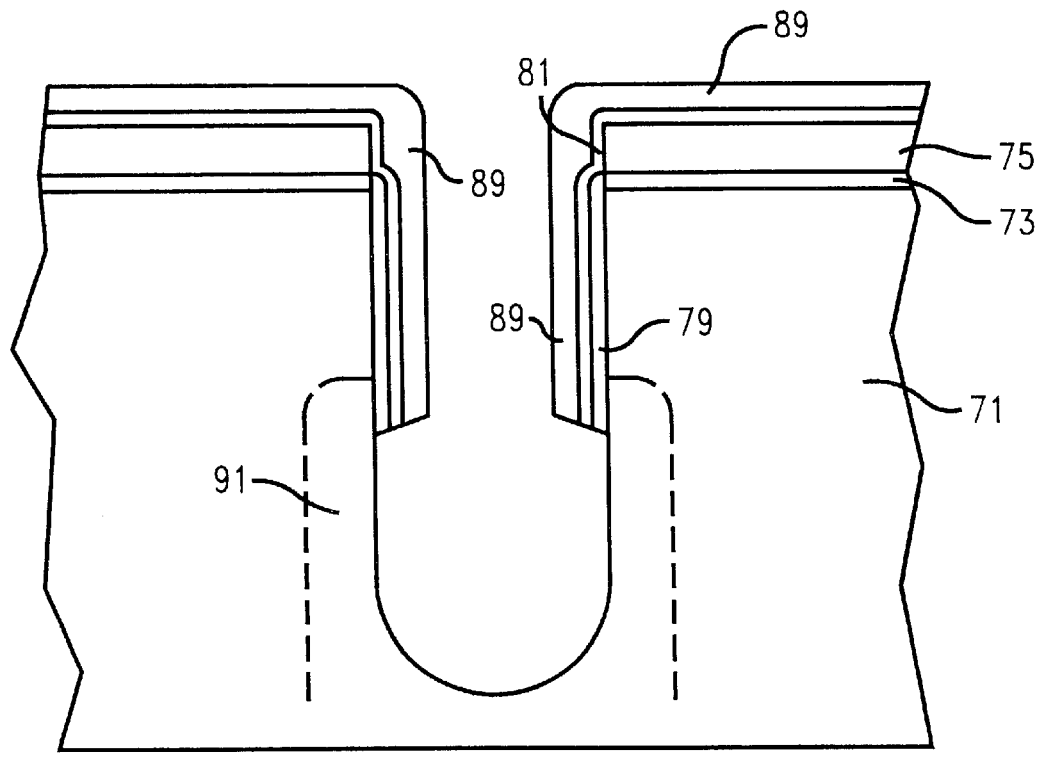
Figure 3:
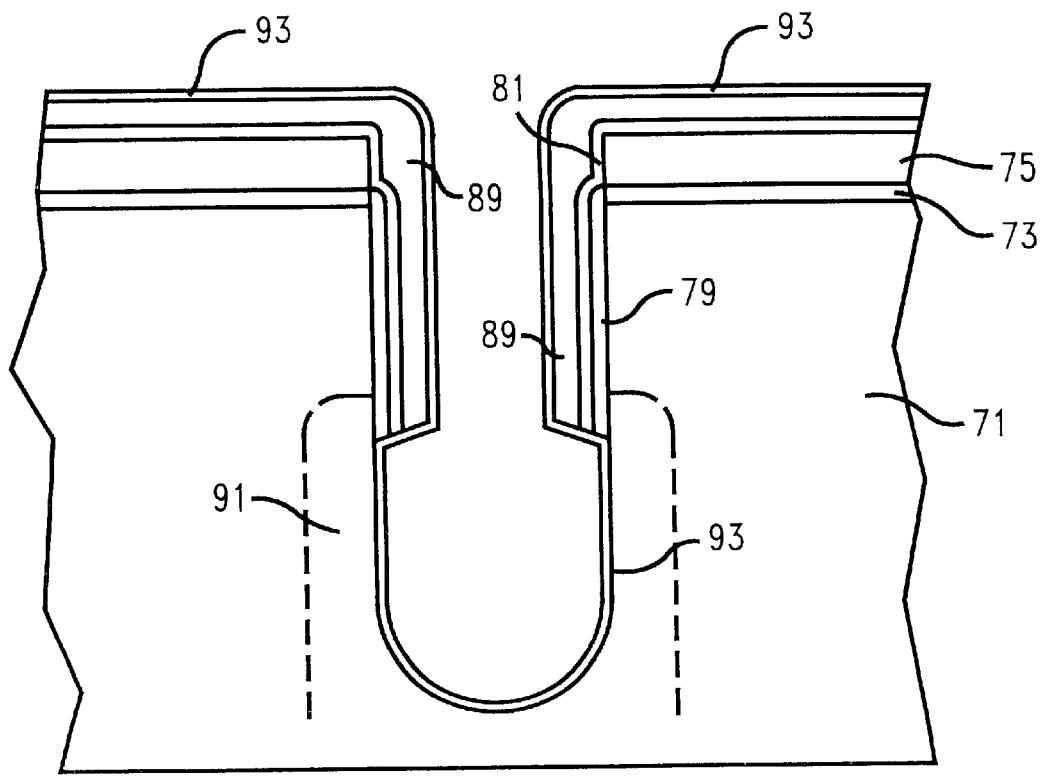
Figure 3:
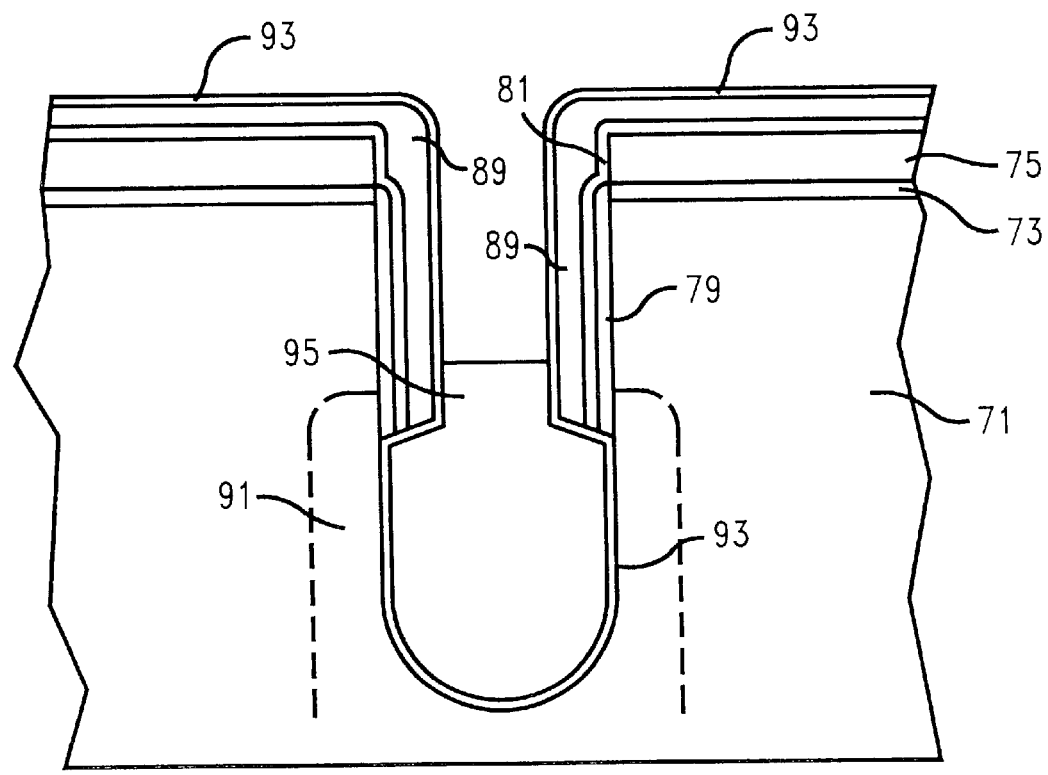

Following the formation of the amorphous silicon oxide layer, a layer of nitride 85 is formed on the silicon oxide layer, as shown in FIG. 3D. The nitride layer may be deposited by, for example CVD, to a thickness between 5 and 10 nm with 5.8 nm providing an effective thickness.

After deposition of nitride layer 85, a resist 87 layer is formed on the nitride layer in the bottom portion of the trench, as shown in FIG. 3E. Resist is deposited or spun on by usual photolithographic techniques. The resist is then recessed into the trench to a controlled depth within the trench. This recessing may be done by any number of well-known techniques. The preferred techniques is by chemical downstream etching (CDE). The CDE process is designed to recess resist 87 and to isotropically etch nitride layer 85 selective to the underlying thin oxide. The thin oxide acts as an etch stop to the CDE process, so that the underlying amorphous silicon 83 is not etched.

After removal of nitride layer 85 from exposed regions, resist layer 87 is stripped leaving a region of nitride layer 85 in the bottom of trench 77 overlying a corresponding region of amorphous silicon layer 83. The exposed amorphous silicon in the upper region of the trench is then subjected to thermal oxidation at, for example, 1050° C., to consume all of the amorphous silicon and form an amorphous silicon oxide layer 89 approximately 55 nm thick, as shown in FIG. 3F. In this regard, the region of nitride layer 85 remaining in the bottom of the trench acts as an oxidation barrier to prevent thermal oxidation of the underlying amorphous silicon. The resulting amorphous silicon oxide layer 89 in the upper portion of the trench forms a relatively thin, uniform oxide collar over the circumference of the trench. The silicon nitride layer 81 underlying the oxide collar acts as an oxidation barrier to prevent lateral growth or enlargement of the trench during oxidation of the amorphous silicon. In addition, the silicon nitride layer 81 acts to improve the thickness uniformity of the deposited amorphous silicon layer and, thus, the uniformity of the resulting amorphous silicon oxide collar.

As shown in FIG. 3G, after forming silicon oxide collar 89, a series of etch steps are then employed to remove the various layers in the lower portion of the trench below the collar to allow formation of a trench capacitor. First a nitride etch and oxynitride etch are employed to remove the nitride layer 85 and any oxynitride remaining in the lower portion of the trench, below the oxide collar 89. A wet etch of HF-glycerol or HF-ethylene glycol, for example, may be used for this purpose. This etch step also removes approximately 10 nm of $SiO_2$. A further wet etch is then employed to etch the amorphous silicon underlying the etched away nitride layer. Such etch should be selective to oxide and nitride. For example, $NH_4OH$ may be used for this purpose. Another wet nitride etch is then used to remove deep trench nitride liner 81 in the lower portion of the trench. This etch should be selective to oxide in the lower portion of the trench. Again, HF-glycerol or HF-ethylene glycol, for example, may be used for this purpose. In addition to nitride, about 10 nm of $SiO_2$ are etched during this step. A trench bottling process using $NH_4OH$ may be employed at this point to enlarge the lower portion of the trench. Alternatively, the trench can be left as is.

After removing the various layers in the trench below the collar so as to expose the sidewalls of the silicon substrate 71, a n-type buried plate 91 may be formed, as in FIG. 3H. This plate may be formed at this point by arsenic gas phase doping. Alternatively, the plate could have been prepared by ion implantation of n-type dopants after initial formation of the trench, as shown in FIG. 3A. Another approach to forming the plate after initial formation of the trench would be to line the trench in the plate region with a dopant source, such as arsenic silicate glass, and outdiffuse the dopants into the substrate, as is known to those skilled in the art. Although not shown in FIG. 3H, the plate diffusion region may extend into the diffusion regions of adjacent cells to provide a common plate.

Thereafter, a thin nitride layer is deposited, for example, by CVD, as shown in FIG. 3I. This is followed by subjecting the nitride layer to thermal reoxidation at about 900° C. or less to thus form the node dielectric layer 93. The use of a nitride/oxide layer improved the quality of the node dielectric.

Following formation of node dielectric layer 93, a heavily doped n-type polysilicon layer is deposited filling the trench.

The polysilicon may then be annealed to heat the polysilicon seam. Chem-mech polishing (CMP) is then used to planarize the substrate down to node dielectric layer 93 providing a co-planar surface with it and the heavily doped polysilicon. RIE selective to oxide and nitride is then used to recess the polysilicon in the trench to form the second plate of the capacitor or storage node, as shown in FIG. 3J. Thereafter, node dielectric layer 93 above the storage node may be removed using a nitride etch.

It should be understood that where fabrication of the collar in accordance with the present invention is for a cell structure such as shown in FIG. 1, the polysilicon 95 in FIG. 3J would only be recessed by RIE to a depth sufficient to enable formation of buried strap 28. Similarly, buried plate 91 in FIG. 3J would only be formed to the lower end of collar 89, so as to conform to the collar-buried plate cell structure shown in FIG. 1. Alternatively, where formation of the collar is for a cell structure such as shown in FIG. 2A, the polysilicon 95 in FIG. 3J would be recessed to an intermediate point of the collar 89, as shown in FIG. 2A.

After recess of polysilicon 95 to the desired depth in the trench as shown in FIG. 3J, the remainder of the trench is filled with a resist to the top surface of the pad nitride 75. RIE may then be used to remove node dielectric layer 93 and the amorphous silicon oxide layer to the top of pad nitride 75. The resist is then removed.

With reference to the cell structure shown in FIG. 1, after removal of the node dielectric layer and amorphous silicon layer on the top surface of the silicon substrate, node dielectric, amorphous silicon oxide, nitride liner and oxide layers along the trench walls are etched to the recessed polysilicon. Buried strap 28 may then be formed on the polysilicon. After formation of the buried strap 28, diffusion of dopants into the substrate is undertaken to form diffusion region 27, A layer of intrinsic polysilicon may then be deposited over the surface of the substrate covering the pad nitride and filling the trench and buried strap. The polysilicon may than be polished by RIE to complete formation of the buried strap. The non-active region of the cell may then be anisotropically etched by RIE, for example, to provide a shallow trench for shallow trench isolation 29.

With reference to further fabricating the cell structure shown in FIG. 2A and B, it is clear that any variety of process steps may be employed. For example, the process described in the above-cited co-pending applications may be used and such description is incorporated herein by reference. In general terms, after recessing the polysilicon to form node plate 95, as shown in FIG. 3J, a portion of collar 49 in FIG. 2A, which portion is shown at 51 in FIG. 2B, may be removed to a level slightly below the level of the recessed polysilicon to expose the silicon substrate. The removed collar oxide recess at 54 below the level of polysilicon is then used for an outdiffusion of n-type dopants to form buried strap 53 which acts as the drain diffusion. The recess at 54 used for the outdiffusion to form the buried plate is then filled with highly n-type doped polysilicon and trench top oxide layer 57 is formed to separate plate 47 from yet to be formed vertical gate 55. The silicon exposed by the removal of a portion of the collar is then oxidized to form the vertical gate oxide. The trench is then filled with heavily n-type doped polysilicon to form vertical gate 55. Thereafter, conventional metallization and passivation steps are carried out to complete fabrication of the cell, as is understood by those skilled in the art and as described in copending applications.

It should be understood that the trench oxide collar process described in accordance with the present invention may be employed in the fabrication of a variety of different trench capacitor DRAM structures and the particular implementation steps employed after such collar formation may vary depending upon design choice and the particular DRAM structures. However, with reference to the vertical gate structure shown in FIGS. 2A and B, it can be seen that the disclosed process acts to minimize trench enlargement during collar formation thereby minimizing loss in the area bitline contact 59 thereby facilitating further reduction in trench spacing.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of forming an isolation collar within the trench of a trench capacitor, comprising:

depositing a nitride liner on the walls of said trench;

depositing a layer of amorphous silicon material on said nitride liner;

depositing an oxidation barrier in said trench;

removing a portion of said oxidation barrier to expose an upper portion of said layer of amorphous silicon material; and oxidizing said upper portion of said layer of amorphous silicon material to form said isolation collar.

2. The method as set forth in claim 1 wherein the thickness of said layer of amorphous silicon material is between 10 nm and 30 nm.

3. The method as set forth in claim 1 wherein the thickness of said nitride liner is between 3 nm and 10 nm.

4. The method as set forth in claim 3 wherein the thickness of said nitride liner is 3.8 nm.

5. The method as set forth in claim 2 wherein said step of oxidizing said amorphous silicon layer oxidizes all of the amorphous silicon.

6. The method as set forth in claim 5 wherein said step of oxidizing comprises thermal oxidation between 800° C. and 1100° C.

7. The method as set forth in claim 1 wherein said step of depositing a nitride liner comprises depositing a nitride liner on an oxide liner on the walls of said trench.

8. The method of forming an isolation collar within the upper portion of the storage trench of a capacitive storage trench DRAM cell, comprising:

depositing a first layer of nitride along the walls of said trench;

depositing a layer of amorphous silicon on said first layer of nitride;

depositing a second layer of nitride on said layer of amorphous silicon;

forming a resist in the lower portion of said storage trench to thereby leave exposed said second layer of nitride in said upper portion of said trench;

removing said second layer of nitride exposed in said upper portion of said trench to thereby expose said layer of amorphous silicon; and thermally oxidizing the exposed amorphous silicon to form a uniform amorphous silicon oxide collar.

9. The method as set forth in claim 8 wherein said step of thermally oxidizing is carried out at between 1000° C. and 1100° C.

10. The method as set forth in claim 8 wherein the thickness of said layer of nitride is between 3 nm and 10 nm and said layer of amorphous silicon is between 10 nm and 30 nm.

11. The method as set forth in claim 10 wherein said layer of nitride is deposited upon a layer of oxide.

12. The method as set forth in claim 8 wherein said capacitive storage trench DRAM cell is a vertical gate capacitive storage trench DRAM cell.

* * * * *